United States Patent
O et al.

(10) Patent No.: US 7,279,753 B1
(45) Date of Patent: Oct. 9, 2007

(54) FLOATING BASE BIPOLAR ESD DEVICES

(75) Inventors: Hugh Sung-Ki O, Fremont, CA (US); Chih-Ching Shih, Pleasanton, CA (US); Yowjuang Bill Liu, San Jose, CA (US); Cheng-Hsiung Huang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/015,402

(22) Filed: Dec. 17, 2004

(51) Int. Cl.
*H01L 23/62* (2006.01)
*H01L 29/76* (2006.01)

(52) U.S. Cl. .................. 257/355; 257/361; 257/370; 257/E27.016; 257/E27.017

(58) Field of Classification Search ............. 257/361, 257/370, 355, 347, E27.016, E27.017, E27.023, 257/E27.043
See application file for complete search history.

(56) References Cited

U.S. PATENT DOCUMENTS

| | | | | |
|---|---|---|---|---|
| 4,940,907 | A * | 7/1990 | Laude | 327/73 |
| 5,751,042 | A * | 5/1998 | Yu | 257/360 |
| RE36,024 | E * | 1/1999 | Ho | 257/356 |
| 6,507,090 | B1 * | 1/2003 | Hu et al. | 257/586 |
| 6,972,466 | B1 * | 12/2005 | Liang et al. | 257/370 |
| 2004/0033645 | A1 * | 2/2004 | Yu | 438/133 |
| 2004/0110353 | A1 * | 6/2004 | Mallikarjunaswamy | 438/309 |
| 2005/0200396 | A1 * | 9/2005 | Hsu et al. | 327/313 |
| 2005/0205937 | A1 * | 9/2005 | Wang | 257/355 |

* cited by examiner

Primary Examiner—Jerome Jackson
Assistant Examiner—Joseph Nguyen
(74) Attorney, Agent, or Firm—Morgan, Lewis & Bockius LLP

(57) ABSTRACT

The present invention includes a bipolar ESD device for protecting an integrated circuit from ESD damage. The bipolar ESD device includes a collector connected to a terminal of the integrated circuit, a floating base, and a grounded emitter. When an ESD pulse hits the terminal of the integrated circuit, the PN junction between the emitter and the base becomes forward biased. The forward biasing of the emitter-base PN junction in turn causes carriers to be injected into the collector-base junction, triggering the bipolar ESD device to turn on to discharge the ESD pulse. The trigger voltage of the bipolar ESD device is a fraction of a breakdown voltage of the collector-base PN junction and can be modified by adjusting a base length of the bipolar ESD device, a junction depth of the collector, or a dopant concentration in the base.

20 Claims, 6 Drawing Sheets

US 7,279,753 B1

FLOATING BASE BIPOLAR ESD DEVICES

BACKGROUND OF THE INVENTION

The present application relates to electronic devices, and more specifically to electrostatic discharge (ESD) protection devices for protecting integrated circuits from ESD damage.

Grounded base N-type metal-oxide-silicon (NMOS) devices have been used for (ESD) protection in integrated circuits. FIG. 1 illustrates a conventional grounded substrate NMOS ESD protection device 100. As shown in FIG. 1, NMOS device 100 includes a polysilicon gate 110 over a P-type substrate or a P-well 120 formed in a semiconductor substrate. NMOS device 100 further includes a N+ source 130 and a N+ drain 140 formed in the P-type substrate or P-well 120. The gate 110 and the source 130 are tied to the ground, and so is the P-type substrate or P-well 120, while the drain 140 is connected to a drain node 141. A parasitic NPN bipolar transistor formed by the N+ drain 140 (as the collector), the P-type substrate or P-well 120 (as the base), and the N+ source 130 (as the emitter) is associated with the NMOS device 100. Thus, NMOS device 100 uses the grounded substrate 120 to cause a break down of the drain to substrate junction 125 in response to an ESD pulse on the drain node 141. The breakdown in turn causes the parasitic bipolar transistor to turn on to discharge the ESD pulse.

The above ESD protection scheme suffers from several disadvantages. First, using the drain to substrate breakdown to turn on the parasitic bipolar transistor results in localized current discharge and non-uniform ESD protection. It also requires a large size for the NMOS device 100 in order to dissipate the heat generated by the localized ESD current. A larger NMOS device contributes larger capacitance and is thus not suitable for high speed protection.

In addition, the junction breakdown voltage of the NMOS device 100 is very close to the oxide breakdown voltages of core transistors in the integrated circuits and is thus not suitable for gate oxide protection. Therefore, there is a need for a more advanced ESD protection device than conventional grounded substrate NMOS devices.

SUMMARY OF THE INVENTION

The present invention includes a bipolar ESD device for protecting an integrated circuit from ESD damage. The bipolar ESD device includes a collector connected to a terminal of the integrated circuit, a floating base, and a grounded emitter. When an ESD pulse hits the terminal of the integrated circuit, the PN junction between the emitter and the base becomes forward biased. The forward biasing of the emitter-base PN junction in turn causes carriers to be injected into the collector-base junction, triggering the bipolar ESD device to turn on to discharge the ESD pulse. The trigger voltage of the bipolar ESD device is a fraction of the breakdown voltage of the collector-base PN junction and can be modulated by adjusting a base length of the bipolar ESD device, a junction depth of the collector, or a dopant concentration in the base.

In one embodiment of the present invention, the bipolar ESD device is formed in polysilicon and the floating base is formed between the emitter and the collector.

In an alternative embodiment of the present invention, the bipolar ESD device is formed in a silicon substrate, and further includes an isolation region between the collector and the emitter. The isolation region can be a shallow trench isolation region, the collector and emitter can be formed using implant and diffusion processes that form source and drain regions of MOS transistors in the integrated circuit, and the base can be formed using implant and diffusion processes that form well regions in the integrated circuit. The bipolar ESD device may further include a deep well having conductivity type opposite to that of the base to isolate the base from the silicon substrate.

In yet another alternative embodiment of the present invention, the bipolar ESD device is formed in silicon on insulator and further includes an isolation region such as a shallow trench isolation between the collector and the emitter.

In one application of the present invention, the bipolar ESD device is connected between an input line and a ground line of a core circuit of the integrated circuit. In another application of the present invention, the bipolar ESD device is connected in parallel with a noise filtering capacitor in a core power circuit of the integrated circuit. In yet another application of the present invention, the bipolar ESD device is connected between a source and a drain of a NMOS device in an input circuit of the integrated circuit. In yet another application of the present invention, the bipolar ESD device is connected in parallel with a noise filtering capacitor in an I/O power circuit of the integrated circuit.

Among the many applications of the present invention, the floating base bipolar (FBB) device can be used to provide superior protection of gate oxide from ESD damage.

DETAILED DESCRIPTION

Figure 1:
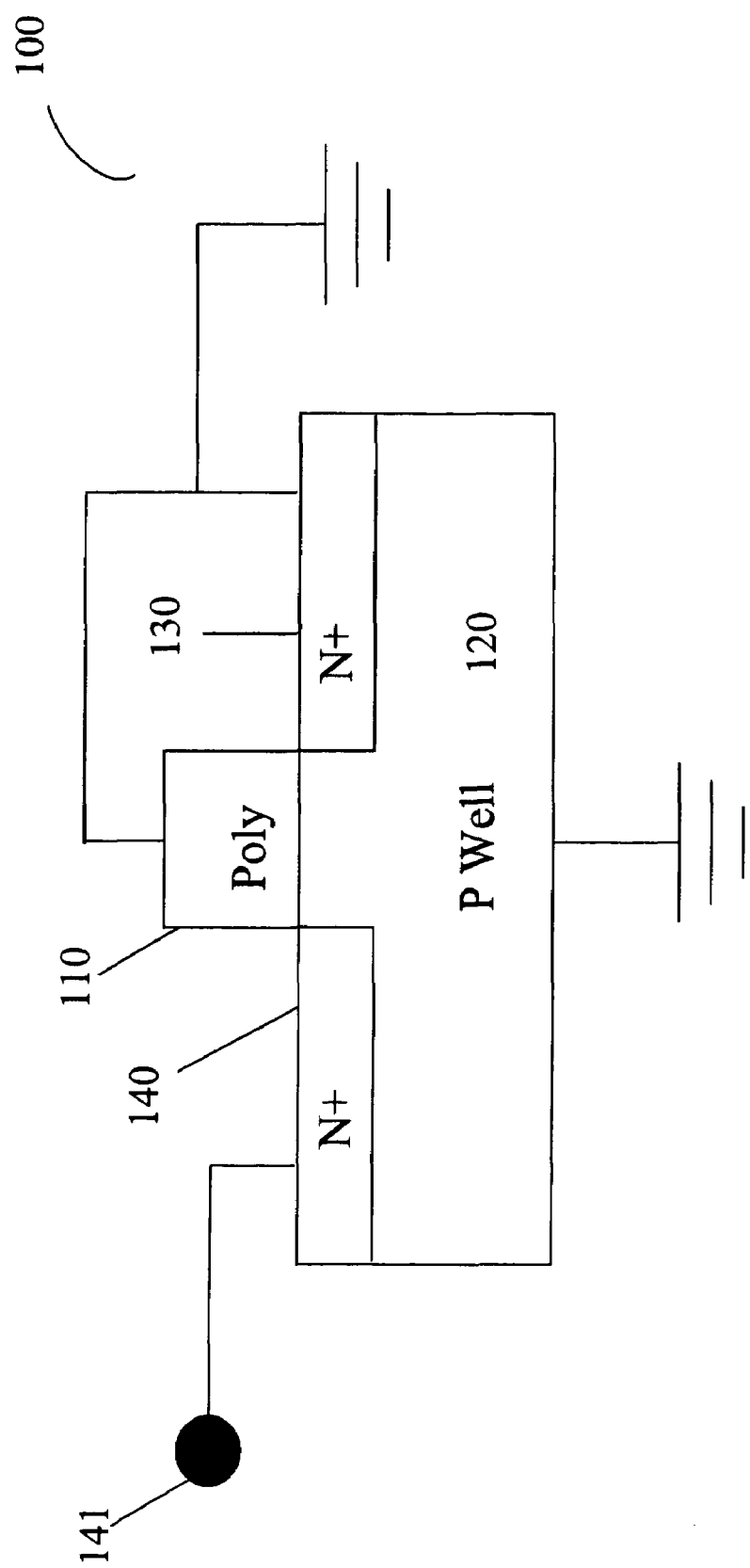
FIG. 1 is a block diagram of a conventional grounded substrate NMOS ESD device.
Figure 2:
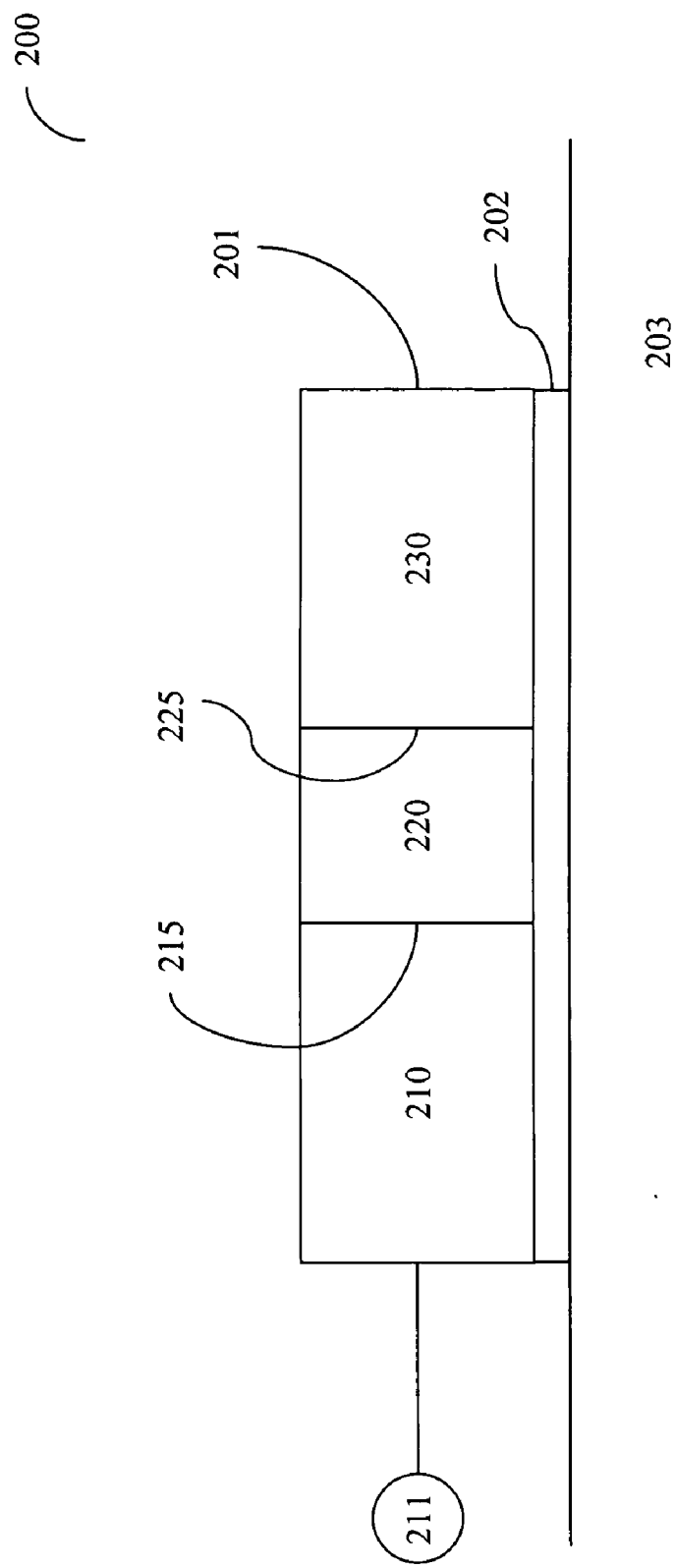
FIG. 2 is a block diagram of a bipolar ESD device according to one embodiment of the present invention.

FIG. 2 illustrates a polysilicon FBB device 200 according to one embodiment of the present invention. As shown in FIG. 2, FBB device 200 is formed in a polysilicon layer 201 formed on an insulating dielectric layer 202 over a semiconductor substrate 203 and includes a collector 210 connected to a terminal 211 of an integrated circuit (not shown), a floating base 220, and an emitter 230 tied to a ground terminal (or bus) of the integrated circuit. An emitter-base junction 225 is located between emitter 230 and base 220 and collector-base junction 215 is located between collector 210 and base 220. Terminal 211 can be a power pin, an input pad, or any other external connection for the integrated circuit. FBB device 200 can either be a PNP bipolar device or a NPN bipolar device. When FBB device 200 is a PNP bipolar device, collector 210 and emitter 230 are doped with one or more P-type dopants, while base 220 is doped with one or more N-type dopants. Conversely, when FBB device 200 is a NPN bipolar device, collector 210 and emitter 230 are doped with one or more N-type dopants, while base 220 is doped with one or more P-type dopants.

When an ESD pulse hits terminal 211 connected to collector 210, the floating base 220 causes forward biasing of emitter-base junction 225 which injects carriers uniformly to collector-base junction 215. The injected carriers trigger a uniform breakdown of the collector-base junction 215 and lead to a uniform current flow between terminal 211 and the ground terminal, discharging the ESD pulse.

Since the breakdown of the collector-base junction 215 is led by impact ionization caused by carriers injected from the forward-biased emitter-base junction 225, the electric field required to sustain the impact ionization is low because the collector-emitter breakdown voltage is low. In other words, the trigger voltage of the FBB device 200 is low. In fact, the trigger voltage VCE across collector 210 and emitter 230 is a fraction of the breakdown voltage VCB of the collector-base junction 215, i.e., $$VCE = G*VCB$$

where G<1, and G can be modified by varying the base length and base doping concentration associated with the FBB device 200. VCB can be modified by varying the junction depth of the collector-base junction 215 and the doping concentration of the base 220.

Lower trigger voltage can be achieved by shortening the base length, i.e., the spacing between the collector 210 and the emitter 230, and by reducing the collector-base junction depth using conventional implant technologies. Lower trigger voltage may also be achieved by adjusting the doping concentration in the base 220 using different implants such as halo implant, LDD implant or field implant, which are also provided by conventional implant technologies.

The FBB device is symmetrical between the collector and the emitter. A single FBB device can also provide discharge of ESD pulses with both positive and negative polarities.

Figure 3:
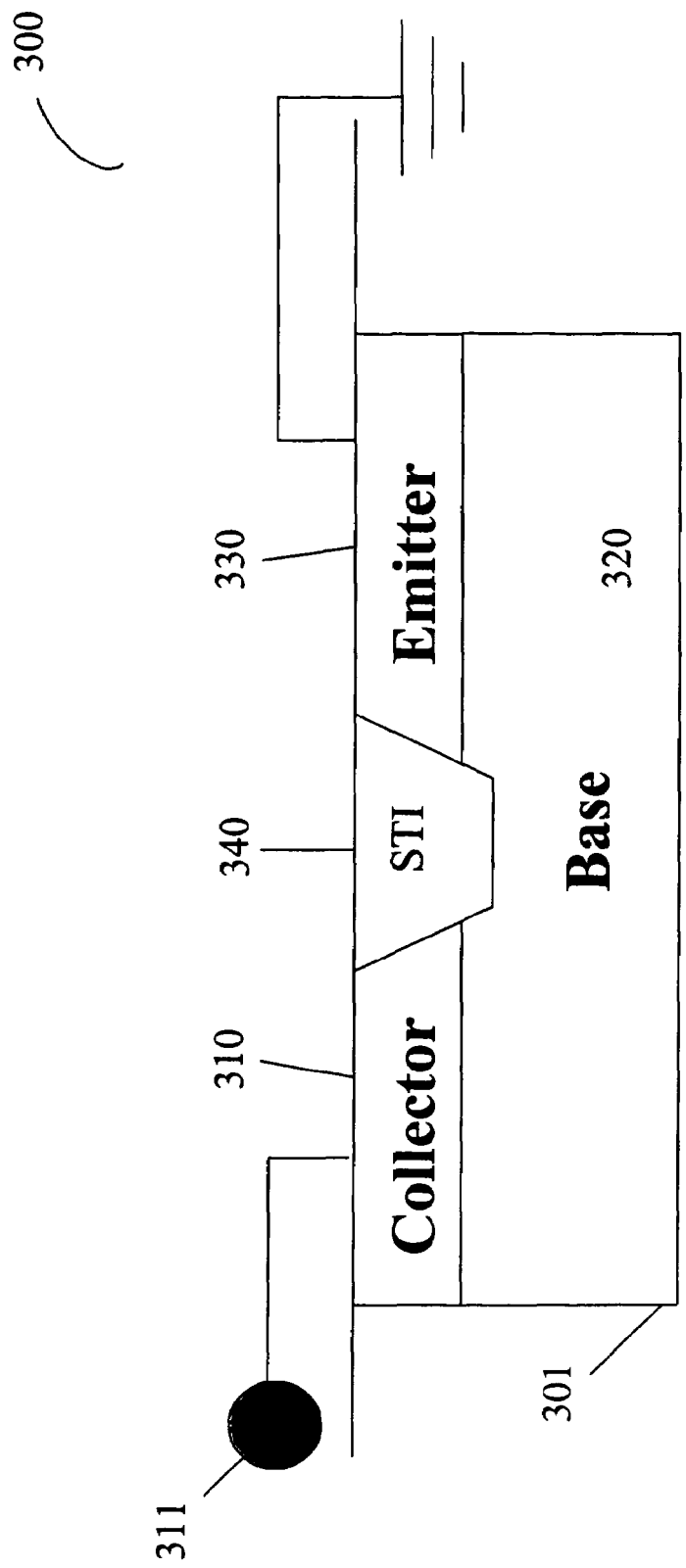
FIG. 3 is a block diagram of a bipolar ESD device according to an alternative embodiment of the present invention.

In addition to forming the FBB device in polysilicon, the FBB device of the present invention can be formed using different materials and technologies. FIG. 3 illustrates a FBB device 300 formed in a silicon substrate 301 for protecting an integrated circuit also built on the substrate 301, according to an alternative embodiment of the present invention. As shown in FIG. 3, FBB device 300 includes a base 320 formed in a silicon substrate 301. Base 320 may be formed using conventional implant and diffusion technologies for forming a P-well if FBB device 300 is a NPN bipolar transistor or N-well if FBB device 300 is a PNP bipolar transistor. Base 320 may be isolated from substrate 301 and thus be kept floating using a deep N-well or P-well (not shown) formed using conventional technologies.

FBB device 300 further includes a collector 310 connected to a terminal 311 of the integrated circuit and an emitter 330 tied to a ground terminal or bus of the integrated circuit. Collector 310 and emitter 330 can be formed using implant and diffusion technologies for forming source/drain diffusions of MOS transistors in the integrated circuit. FBB device 300 further includes an isolation region 340 to provide isolation between collector 310 and emitter 330. Isolation region 340 may be formed using conventional technologies for forming shallow trench isolations (STI).

Again, FBB device 300 can either be a PNP bipolar device or a NPN bipolar device. When FBB device 300 is a PNP bipolar device, base 320 may be a N-well, while collector 310 and emitter 330 may be P+ or P++ diffusions formed in the N-well. Conversely, when FBB device 300 is a NPN bipolar device, base 320 may be a P-well while collector 310 and emitter 330 may be N+ or N++ diffusions formed in the P-well. The function of FBB device 300 is similar to that of FBB device 200, as described above.

Figure 4:
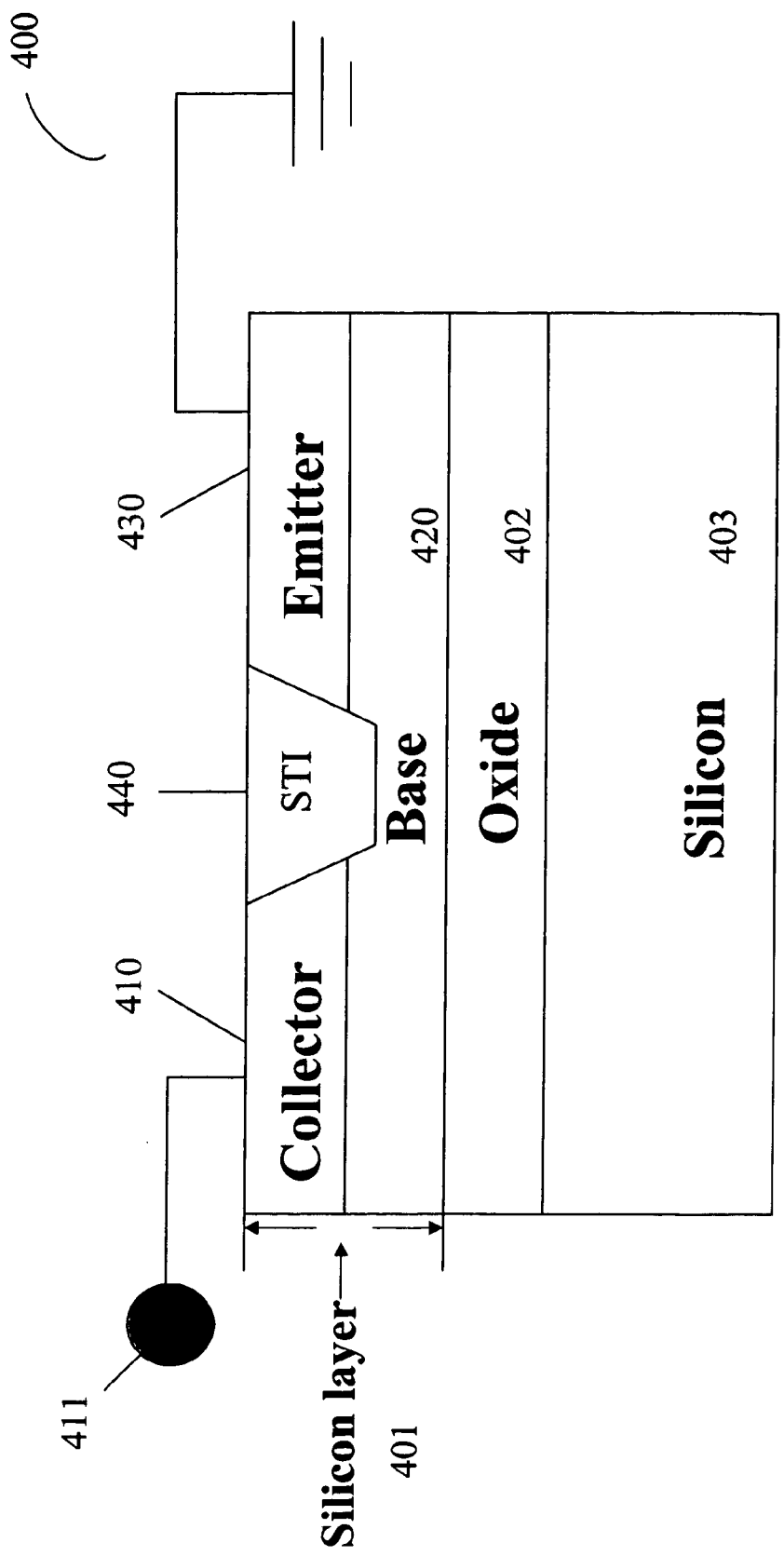
FIG. 4 is a block diagram of a bipolar ESD device according to yet another embodiment of the present invention.

FIG. 4 illustrates a FBB device 400 built using a silicon-on-insulator (SOI) technology, according to yet another alternative embodiment of the present invention. As shown in FIG. 4, FBB device 400 includes a collector 410, a base 420, and an emitter 430 formed in a silicon layer 401, which in turn is formed on an oxide layer 402 over a semiconductor substrate 403. FBB device 400 further includes an isolation region 440 to provide isolation between collector 410 and emitter 430. Isolation region 440 may be formed using conventional technologies for forming shallow trench isolations (STI).

Again, FBB device 400 can either be a PNP bipolar device or a NPN bipolar device. When FBB device 400 is a PNP bipolar device, base 420 may be formed by doping a section of the silicon layer 401 with N-type dopants, while collector 410 and emitter 430 may be P+ or P++ diffusions formed in the section of the silicon layer 401. Conversely, when FBB device 400 is a NPN bipolar device, base 420 may be formed by doping a section of the silicon layer 401 with P-type dopants, while collector 410 and emitter 430 may be N+ or N++ diffusions formed in the section of the silicon layer 401.

The FBB device of the present invention, whether it is built in polysilicon (like FBB device 200), in bulk silicon (like FBB device 300), in SOI (like FBB device 400), or using some other materials or technologies, has many advantages over conventional grounded substrate NMOS ESD protection devices. It has a lower clamp voltage and a uniform current flow that scales with the width of the FBB device. Because of the current uniformity, the FBB device can be made smaller than conventional NMOS ESD protection devices and thus contributes less capacitance. There is also no oxide breakdown problems commonly associated with conventional NMOS devices because the FBB device uses no polysilicon gate. Moreover, the current carrying capability of the FBB device may improve with technology scaling because the base length can be reduced as technology advances.

Figure 5:
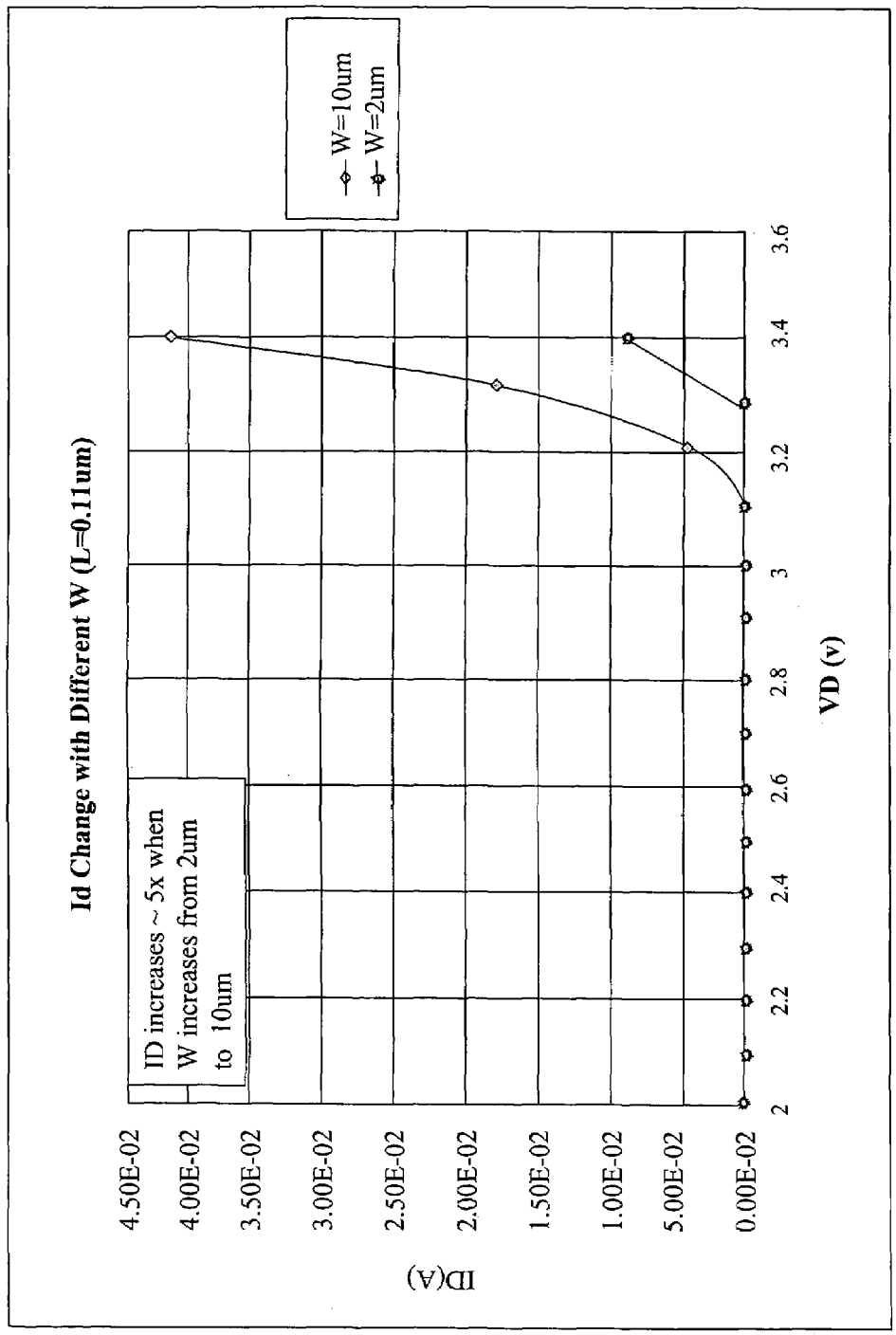
FIG. 5 is a chart illustrating scaling of a discharge current with a device width of the bipolar ESD device.

FIG. 5 is a chart illustrating the scaling of the discharge current ID with the device width of the FBB device. As shown in FIG. 5, the discharge current increases by 5 times when the device width increases from 2 μm to 10 μm.

Figures 6, 7, 8, 9:
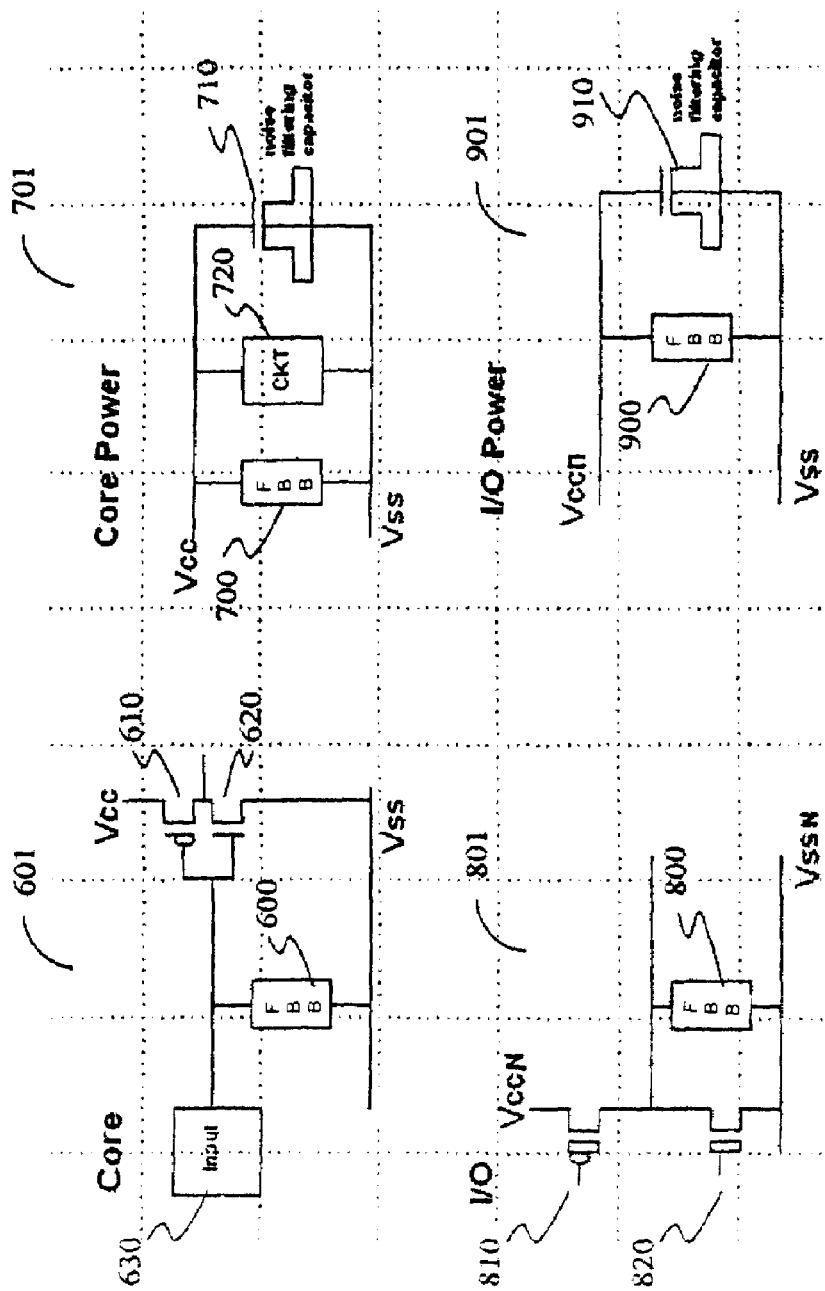
FIGS. 6-9 are circuit diagrams illustrating application of the bipolar ESD device.

FIGS. 6-9 illustrate examples of using the FBB device for protecting integrated circuits against ESD damage. As shown in FIG. 6, an FBB device 600 may be used to protect the gate oxides of a pair of CMOS transistors 610 and 620 coupled between a power line $V_{CCN}$ and a ground line $V_{SSN}$ and having their gate connected to an input pad 630. The collector and emitter terminals of FBB device 600 are connected between the input pad 630 and the ground line $V_{SSN}$ to shunt any ESD pulse on the input pad 630. Similarly, a FBB device can be connected between the power line $V_{CCN}$ and the input 630 to provide ESD discharge between the two terminals.

As shown in FIG. 7, an FBB device 700 may be used to protect the oxide layer in a noise filtering capacitor 710 in a core power circuit 701. The noise filtering capacitor 710 is coupled in parallel with a circuit device 720 and between a power line $V_{CCN}$ and a ground line $V_{SSN}$. The collector and emitter terminals of FBB device 700 are coupled in parallel with the noise filtering capacitor 710 and the circuit device 720 to shunt any ESD pulse on the power line $V_{CCN}$. This also provides ESD discharge between $V_{CCN}$ and $V_{SSN}$ to protect the core circuits.

As shown in FIG. 8, an FBB device 800 may be used to protect an input/output (I/O) circuit 801 including a P-type metal-oxide-semiconductor (PMOS) transistor 810 and a NMOS transistor 820. The collector and emitter terminals of FBB device 800 are connected between the source and drain of the NMOS transistor 820, which is more susceptible to ESD damage than the PMOS transistor 810. This provides ESD discharge between input/output (I/O) and the I/O ground $V_{SSN}$. Similarly, a FBB device can be connected between the I/O power line $V_{CCN}$ and the input/output (I/O) to provide ESD discharge between the two terminals.

As shown in FIG. 9, an FBB device 900 may be used to protect an I/O power circuit 901 including a noise filtering capacitor 910. The noise filtering capacitor 910 is coupled between a core power line $V_{CCN}$ and a ground line $V_{SSN}$. The collector and emitter terminals of FBB device 900 are coupled in parallel with the noise filtering capacitor 910 to protect the noise filtering capacitor 910 from oxide breakdown in an ESD event. This also provides ESD discharge between the I/O power line $V_{CCN}$ and the ground $V_{SSN}$ to protect the I/O circuits.

FBB device 600, 700, 800, or 900 can be built in polysilicon (as FBB device 200), in bulk silicon (as FBB device 300), in SOI (as FBB device 400), or using some other materials or technologies.

What is claimed is:

1. A bipolar ESD device for protecting an integrated circuit from ESD damage, comprising:
    a collector connected to a terminal of the integrated circuit;
    a floating base; and
    a grounded emitter;
    wherein the collector and emitter are connected between a source and a drain of an NMOS device in an input circuit of the integrated circuit to be protected; and
    wherein a first PN junction between the emitter and the base becomes forward biased in response to an ESD pulse on the terminal, causing the bipolar ESD device to turn on to discharge the ESD pulse.

2. The bipolar ESD device of claim 1 wherein the forward biasing of the first PN junction triggers a breakdown of a second PN junction between the collector and the base.

3. The bipolar ESD device of claim 2 wherein a trigger voltage of the bipolar ESD device is a fraction of a breakdown voltage of the second PN junction.

4. The bipolar ESD device of claim 3 wherein the trigger voltage scales with base length of the bipolar ESD device.

5. The bipolar ESD device of claim 3 wherein the trigger voltage scales with junction depth of the collector.

6. The bipolar ESD device of claim 3 wherein the trigger voltage scales with dopant concentration in the base.

7. The bipolar ESD device of claim 1 connected between an input line and a ground line of a core circuit of the integrated circuit.

8. The bipolar ESD device of claim 1 formed in polysilicon.

9. The bipolar ESD device of claim 8 wherein the base is between the emitter and the collector.

10. The bipolar ESD device of claim 1 formed in a silicon substrate.

11. The bipolar ESD device of claim 10 further comprising an isolation region between the collector and the emitter.

12. The bipolar ESD device of claim 11 wherein the isolation region is a shallow trench isolation region.

13. The bipolar ESD device of claim 10 wherein the collector and emitter are formed using implant and diffusion processes that form source and drain regions of MOS transistors in the integrated circuit.

14. The bipolar ESD device of claim 10 wherein the base is formed using implant and diffusion processes that form well regions in the integrated circuit.

15. The bipolar ESD device of claim 14 further comprising a deep well having a conductivity type opposite to that of the base isolating the base from the silicon substrate.

16. The bipolar ESD device of claim 10 wherein the base is under the collector and the emitter in the silicon substrate.

17. The bipolar ESD device of claim 1 formed in silicon on insulator.

18. The bipolar ESD device of claim 17 further comprising an isolation region between the collector and the emitter.

19. A bipolar ESD device for protecting an integrated circuit from ESD damage, the bipolar ESD device being connected in parallel with a noise filtering capacitor in a core power circuit of the integrated circuit, the bipolar ESD device comprising:
    a collector connected to a terminal of the integrated circuit;
    a floating base; and
    a grounded emitter;
    wherein a first PN junction between the emitter and the base becomes forward biased in response to an ESD pulse on the terminal, causing the bipolar ESD device to turn on to discharge the ESD pulse.

20. A bipolar ESD device for protecting an integrated circuit from ESD damage, the bipolar ESD device being connected in parallel with a noise filtering capacitor in an I/O power circuit of the integrated circuit, the bipolar ESD device comprising:
    a collector connected to a terminal of the integrated circuit;
    a floating base; and
    a grounded emitter;
    wherein a first PN junction between the emitter and the base becomes forward biased in response to an ESD pulse on the terminal, causing the bipolar ESD device to turn on to discharge the ESD pulse.

* * * * *